United States Patent
Liu et al.

(10) Patent No.: US 11,996,717 B2
(45) Date of Patent: May 28, 2024

(54) FERRITE COLD PLATE FOR ELECTRIC VEHICLE WIRELESS CHARGING

(71) Applicant: Toyota Motor Engineering & Manufacturing North America, Inc., Plano, TX (US)

(72) Inventors: Yanghe Liu, Ann Arbor, MI (US); Feng Zhou, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 343 days.

(21) Appl. No.: 17/476,764

(22) Filed: Sep. 16, 2021

(65) Prior Publication Data

US 2023/0085399 A1    Mar. 16, 2023

(51) Int. Cl.
| | |
|---|---|
| *H01M 10/46* | (2006.01) |
| *B60L 53/12* | (2019.01) |
| *B60L 53/302* | (2019.01) |
| *H02J 7/00* | (2006.01) |
| *H02J 50/00* | (2016.01) |
| *H02J 50/10* | (2016.01) |
| *H05K 7/20* | (2006.01) |

(52) U.S. Cl.
CPC ............ *H02J 7/0042* (2013.01); *B60L 53/12* (2019.02); *B60L 53/302* (2019.02); *H02J 50/005* (2020.01); *H02J 50/10* (2016.02); *H05K 7/20254* (2013.01); *H05K 7/20927* (2013.01)

(58) Field of Classification Search
CPC ........ H02J 7/0042; H02J 50/005; H02J 50/10; H02J 50/70; H05K 7/20254; H05K 7/20927; Y02T 10/7072; Y02T 90/14; B60L 53/302; B60L 53/12
USPC .......................................... 320/107, 108, 114
See application file for complete search history.

(56) References Cited

U.S. PATENT DOCUMENTS

| | | | |
|---|---|---|---|
| 5,128,635 | A | 7/1992 | Vaughan et al. |
| 9,931,952 | B2 | 4/2018 | Tripathi et al. |
| 9,969,282 | B2 | 4/2018 | Tripathi et al. |

(Continued)

FOREIGN PATENT DOCUMENTS

| | | | | |
|---|---|---|---|---|
| CN | 112977103 A | | 6/2021 | |
| EP | 3419031 A1 | * | 12/2018 | ............ B60L 3/0023 |
| WO | 2019194419 A1 | | 10/2019 | |

*Primary Examiner* — Edward Tso
(74) *Attorney, Agent, or Firm* — Christopher G. Darrow; DARROW MUSTAFA PC

(57) ABSTRACT

A wireless charging pad includes a rectifier, a receiver coil, a heat spreader plate sandwich between the rectifier and the receiver coil, and a ferrite cold plate sandwiched between the receiver coil and the heat spreader plate. The ferrite cold plate has a fluid inlet, a fluid outlet, and a fluid chamber in fluid communication with the fluid inlet and the fluid outlet. The fluid chamber includes a primary cooling chamber and a secondary cooling chamber. Primary cooling fins extending from the heat spreader plate are disposed in the primary cooling chamber and secondary cooling fins extending from a base of the ferrite cooling plate are disposed in the secondary cooling chamber. The ferrite cooling plate cools the rectifier and inhibits or blocks electromagnetic leakage from the receiver coil from interfering with operation of rectifier.

20 Claims, 6 Drawing Sheets

(56) References Cited

U.S. PATENT DOCUMENTS

| 10,658,100 | B2 | 5/2020 | Yuasa | |
| 10,673,349 | B2 * | 6/2020 | Nishizawa | H05K 7/209 |
| 2019/0035543 | A1 * | 1/2019 | Suzuki | H01F 27/40 |

* cited by examiner

FERRITE COLD PLATE FOR ELECTRIC VEHICLE WIRELESS CHARGING

TECHNICAL FIELD

The present disclosure generally relates to wireless charging modules (pads) and, more particularly, to in-vehicle wireless charging pads.

BACKGROUND

Electric vehicles (EVs) can be inductively wireless charged automatically without the use of electric cables. Particularly, an inductive wireless power transfer system (WPTS) with a transmitter coil located under an EV (e.g., buried in pavement or in a transmitter pad on the pavement) generates an alternating electromagnetic field that intersects a receiver coil on an underside of the EV. Intersection of the alternating electromagnetic field with the receiver coil creates an alternating current in the receiver coil and a power converter (e.g., a rectifier) draws the alternating current from the receiver coil and converts the alternating current to direct current that charges a battery of the EV.

Inductive WPTSs transmit more power than other (e.g., capacitive) WPTSs due at least in part to relatively higher energy densities of the alternating electromagnetic field in free space. As such, inductive WPTSs handle and operate at higher power levels than other WPTSs. However, inductive WPTSs suffer from power losses due to resistance in the transmitter and receiver coils, do not operate if a metallic body is between the transmitter and receiver coils, and produce appreciable electromagnetic interferences. In addition, the rectifier on the receiver side of an inductive WPTS generates more heat than rectifiers in other WPTSs due to conversion of higher alternating currents to direct current. Accordingly, traditional receiver side rectifiers (also known as "in-vehicle rectifiers") are spaced apart from the receiver coil to minimize or prevent heat transfer from the rectifier to the power receiver coil and to minimize or prevent electromagnetic interference from the receiver coil affecting operation of the rectifier.

The present disclosure addresses the issues of in-vehicle rectifier heat generation and electromagnetic interference from a receiver coil during wireless charging of an EV, among other issues related to wireless charging of EVs.

SUMMARY

This section provides a general summary of the disclosure, and is not a comprehensive disclosure of its full scope or all of its features.

In one form of the present disclosure, a wireless charging pad includes a rectifier, a receiver coil, and a ferrite cold plate in thermal contact with and sandwiched between the rectifier and the receiver coil. The ferrite cold plate includes a fluid inlet, a fluid outlet, and a fluid chamber in fluid communication with the fluid inlet and the fluid outlet.

In another form of the present disclosure, a wireless charging pad includes a printed circuit board (PCB)-based rectifier, a PCB-based receiver coil, a heat spreader plate in thermal contact with the PCB-based rectifier and sandwiched between the PCB-based rectifier and the PCB-based receiver coil, and a ferrite cold plate in thermal contact with and sandwiched between the PCB-based receiver coil and the heat spreader plate. The ferrite cold plate includes a fluid inlet, a fluid outlet, a fluid chamber in fluid communication with the fluid inlet and the fluid outlet, and a plurality of fins disposed in the fluid chamber and configured to direct flow of a cooling fluid from the fluid inlet to the fluid outlet.

In still another form of the present disclosure, a wireless charging pad includes a PCB-based rectifier, a PCB-based receiver coil, a heat spreader plate in thermal contact with the PCB-based rectifier and sandwiched between the PCB-based rectifier and the PCB-based receiver coil, and a ferrite cold plate in thermal contact with and sandwiched between the PCB-based receiver coil and the heat spreader plate. The ferrite cold plate includes a fluid inlet, a fluid outlet, a fluid chamber in fluid communication with the fluid inlet and the fluid outlet, and a plurality of fins disposed in the fluid chamber and configured to direct flow of a cooling fluid from the fluid inlet to the fluid outlet. In addition, the fluid chamber includes a primary cooling chamber in thermal contact with the PCB-based rectifier, a secondary cooling chamber in thermal contact with the PCB-based receiver coil, and a plurality of primary fins extending from the heat spreader plate disposed in the primary cooling chamber.

Further areas of applicability and various methods of enhancing the above coupling technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present disclosure generally relates to an inductive WPTS for wireless charging an EV. The inductive WPTS includes an in-vehicle wireless power receiver pad or module (simply referred to herein as "receiver pad") with a power receiver coil (referred to herein simply as "receiver coil"), a rectifier, and a ferrite cold plate in thermal contact with and sandwiched between the receiver coil and the rectifier. The ferrite cold plate inhibits electromagnetic interference between the receiver coil and the rectifier and includes a fluid chamber that extracts heat from and cools the rectifier during and/or after wireless charging of an EV. Accordingly, the receiver coil and the rectifier are packaged in a low-profile receiver pad without electromagnetic leakage from the receiver coil interfering with desired operation of the rectifier, and without heat from the rectifier interfering with desired operation of the receiver coil.

Figure 1:
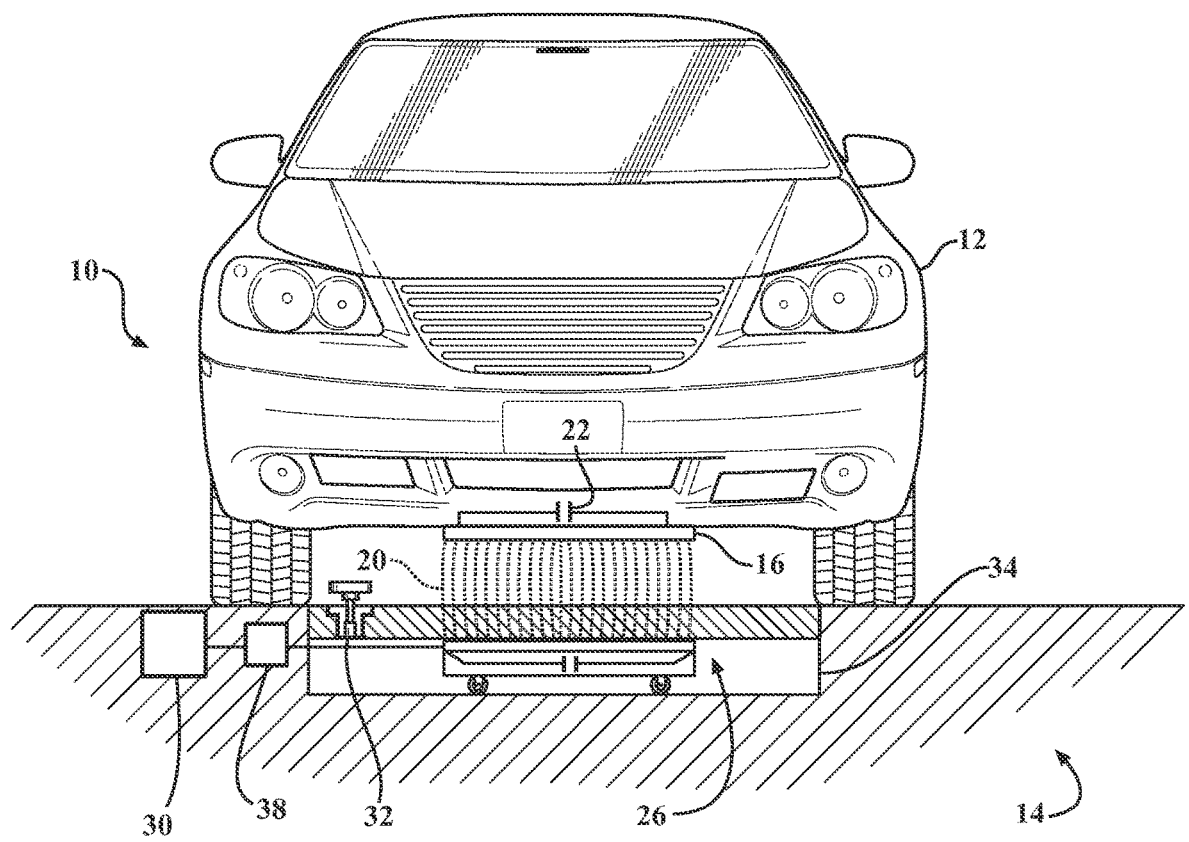
FIG. 1 is a front view of vehicle being wirelessly charged with an inductive WPTS having an in-vehicle wireless receiver pad according to the teachings of the present disclosure.

Referring to FIG. 1, a front view of an inductive WPTS 10 wirelessly charging a vehicle 12 is shown. The inductive WPTS 10 includes a charging station 14 with a transmitter coil 26, a power source 30, a processor 38, at least one sensor 32, an in-vehicle wireless receiver pad 16, and a vehicle battery (not shown). The transmitter coil 26 generates an alternating electromagnetic field 20 that intersects a receiver coil 120 (FIG. 2) included with or within the in-vehicle wireless receiver pad 16 as described in greater detail below. While the vehicle 12 shown in FIG. 1 is an automobile, it should be understood that other vehicles, including but not limited to a watercraft, an aircraft, a space craft, a golf cart, a motorcycle, and/or any other form of motorized transport are included in the teachings of the present disclosure. In addition, the vehicle 12 can be battery electric vehicle, a plug-in hybrid electric vehicle, or any other form of electric vehicle.

Figure 2:
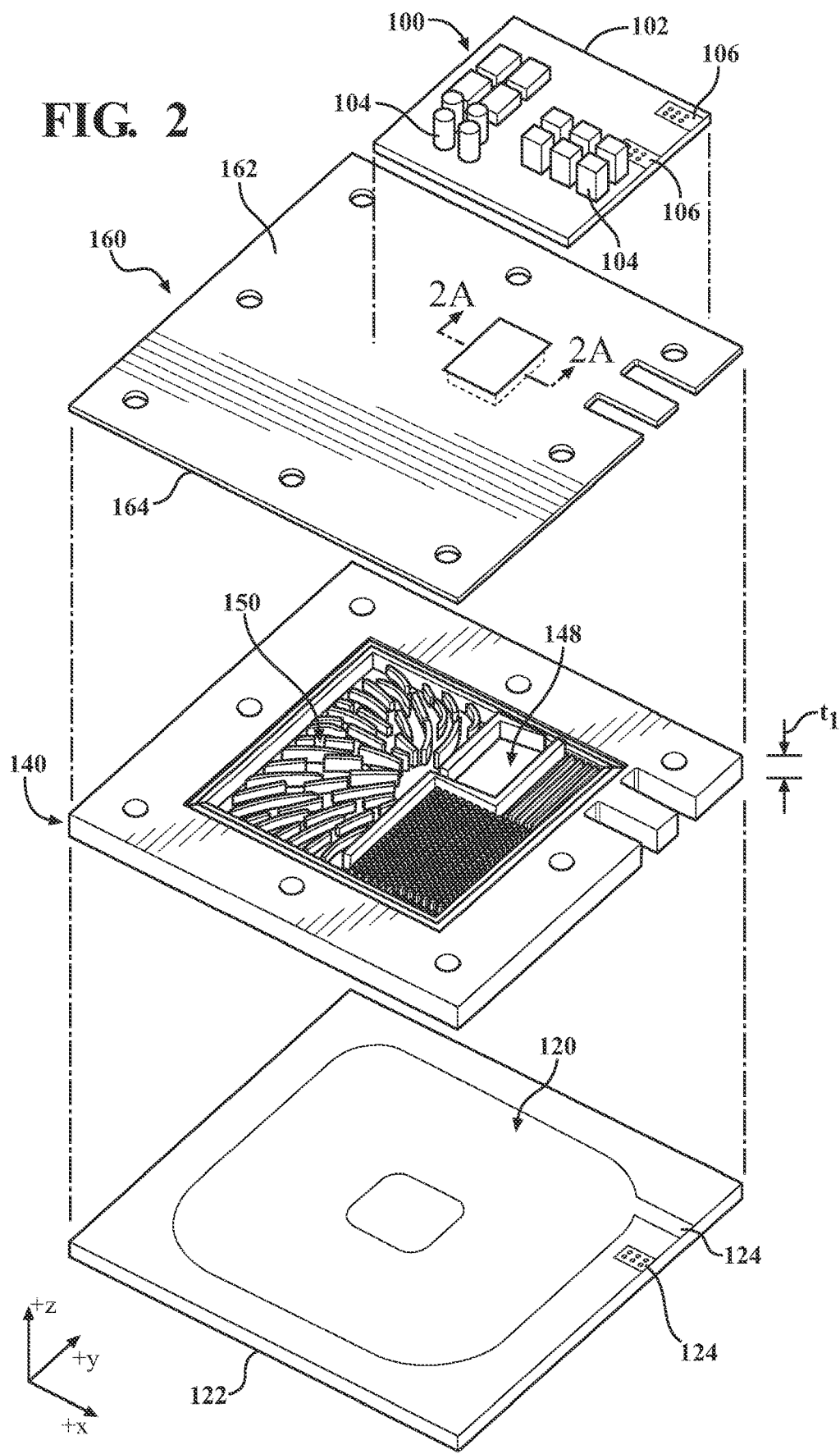
FIG. 2 is an exploded view of the in-vehicle wireless power receiver pad in FIG. 1 with a ferrite cold plate according to the teachings of the present disclosure.

Referring to FIG. 2, an exploded view of the in-vehicle wireless receiver pad 16 without a housing is shown for clarity. The in-vehicle wireless receiver pad 16 includes a rectifier 100, the receiver coil 120, and a ferrite cold plate 140 in thermal contact with and sandwiched between the rectifier 100 and the receiver coil 120. In some variations the rectifier is a printed circuit board (PCB)-based rectifier 100 attached to a substrate 102 along with one or more additional electronic components 104 and electrical contacts 106. As used herein, the term "PCB-based" refers to an electronic component that is attached to a printed circuit board. For example, in some variations the electronic component is printed or soldered onto the PCB.

In at least one variation the receiver coil 120 is a PCB-based receiver coil attached to a substrate 122 along with one or more electrical contacts 124. The ferrite cold plate 140 is formed from any material desirable to inhibit or block electromagnetic leakage from the receiver coil 120 from interfering with operation of the rectifier 100. The ferrite cold plate 140 has a thickness 't1' between about 5 millimeter (mm) and about 25 mm and non-limiting examples of materials from which the ferrite cold plate 140 is formed include manganese zinc ferrite materials, nickel zinc ferrite materials, ferrite-ceramic composites, among others.

Figure 2A:
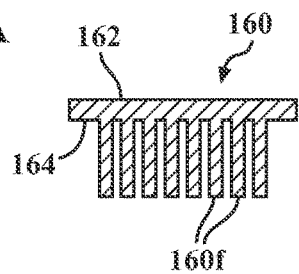
FIG. 2A is cross-sectional view of section 2A-2A in FIG. 2.
Figure 2B:
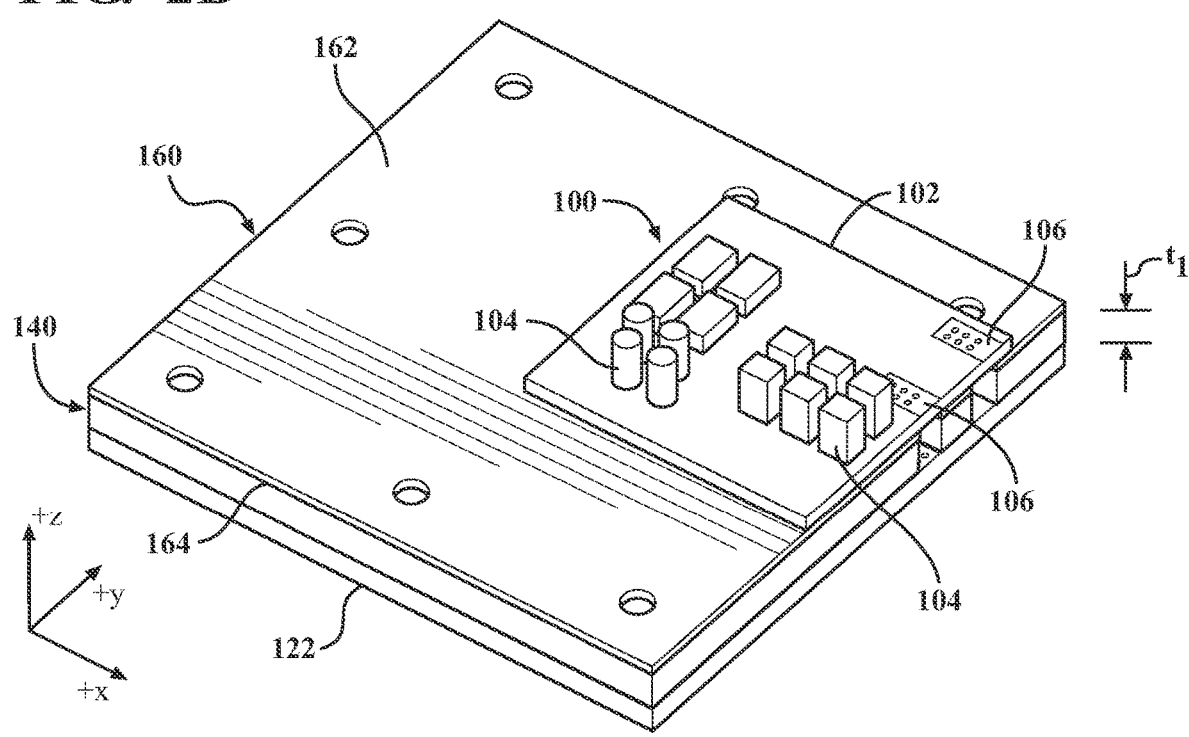
FIG. 2B is a perspective assembled view of FIG. 2.

In some variations, a heat spreader plate 160 is included and sandwiched between the rectifier 100 and the ferrite cold plate 140 as shown in FIG. 2B. The heat spreader plate has an upper (+z direction) surface 162 in thermal contact with the rectifier and one or more additional electronic components 104 and a lower (−z direction) surface 164 in thermal contact with the ferrite cold plate 140. The heat spreader plate 160 is formed from any material desirable to absorb and transfer heat. Non-limiting examples of materials from which the heat spreader plate is formed include aluminum and aluminum alloys (referred to herein collectively as "aluminum"), copper and copper alloys (referred to herein collectively as "copper"), and graphite, among others. In at least one variation, the heat spreader plate 160 includes a plurality of primary heat transfer fins 160f (also referred to herein as "primary cooling fins" or simply as "primary fins") extending from the lower surface 162 as shown in FIG. 2A. In such variations, the primary fins 160f extend into a cooling chamber of the ferrite cold plate 140 as described in greater detail below.

In some variations, the primary fins 160f are integral with the heat spreader plate 160. As used herein, the term "integral" refers to one part or piece of a component being attached to or extending from another part or piece of the component without a physical interface being present between the parts or pieces of the component. For example, in at least one variation the heat spreader plate 160 is machined from a piece or block of material such that the primary fins 160f are integral with the heat spreader plate 160. In the alternative, in some variations the primary fins 160f extend from and are not integral with the heat spreader plate 160. For example, in at least one variation, one or more of the primary fins 160f are attached to the heat spreader plate 160 via welding, soldering, brazing, and/or use of adhesives and a physical interface is present between the one or more primary fins 160f and the heat spreader plate 160. It should be understood that a physical interface between the primary fins 160f and the heat spreader plate 160 inhibit heat transfer therebetween. Accordingly, primary fins 160f that are integral with the heat spreader plate 160 provide enhanced heat transfer compared to primary fins 160f that are not integral with the heat spreader plate 160.

Figure 3:
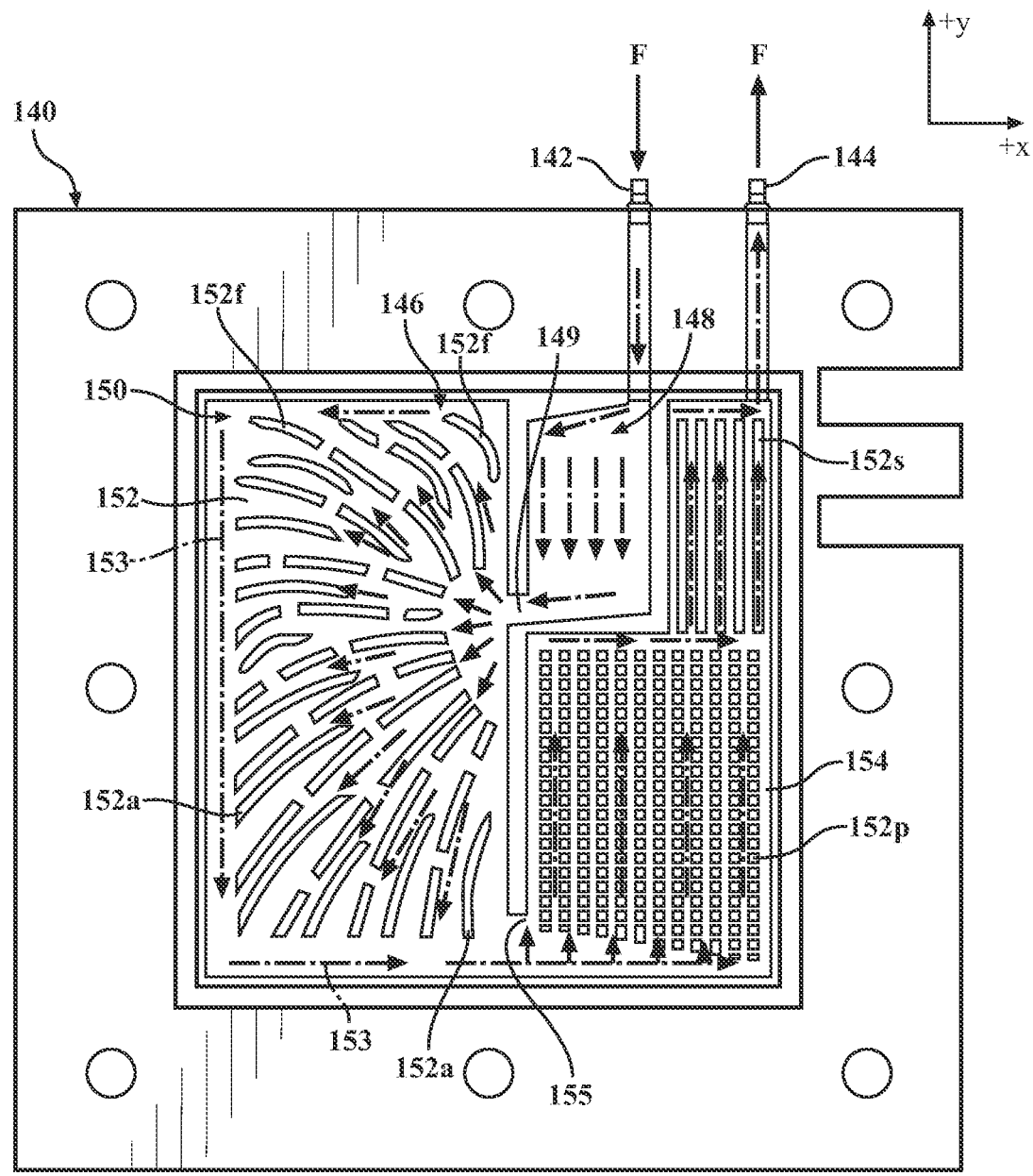
FIG. 3 is a top view of the ferrite cold plate in FIG. 2 according to one form of the present disclosure.

Referring to FIG. 3, a top view of the ferrite cold plate 140 in FIG. 2 is shown. The ferrite cold plate 140 includes a fluid inlet 142, a fluid outlet 144, and a fluid chamber 146 disposed between and in fluid communication with the fluid inlet 142 and the fluid outlet 144. In some variations, the fluid chamber 146 includes a primary cooling chamber 148 (also referred to herein as a "first cooling chamber 148") and a secondary cooling chamber 150 downstream from the first cooling chamber 148. And in at least one variation, the fluid chamber 146 includes the first cooling chamber 148, a second cooling chamber 152, and a third cooling chamber 154. That is, the secondary cooling chamber 150 includes or is split into the second cooling chamber 152 and the third cooling chamber 154. It should be understood that the fluid chamber 146 can have only one cooling chamber or more than three cooling chambers, e.g., four cooling chambers, five cooling chambers, and more.

As noted above, in some variations a plurality of fins disposed in the fluid chamber 146 are included. For example, in at least one variation the primary fins 160f extending from the lower surface 164 of the heat spreader plate 160 extend into the primary cooling chamber 148. Accordingly, the primary fins 160f extend from a surface of the heat spreader plate 160 that is oppositely disposed from the rectifier 100 and into the primary cooling chamber 148. And in some variations, a plurality of secondary fins 152f (also referred to herein as "secondary cooling fins" or simply as "secondary fins") are disposed in the secondary cooling chamber 150. For example, and as shown in FIGS. 2 and 3, in at least one variation the secondary fins 152f extend upwardly (+z direction) from a base 141 of the fluid chamber 146. And in such variations one or more of the secondary fins 152f can be integral with the base 141 and thus the ferrite cold plate 140. For example, in some variations at least a portion of the secondary cooling chamber 150 is formed by machining of the ferrite cold plate 140 such that ferrite material is removed and the secondary cooling chamber 150 with the secondary fins 152f integral with the base 141 is formed. In other variations, the ferrite cold plate 140 is formed by additive manufacturing such that the secondary cooling chamber 150 with the secondary fins 152*f* integral with the base 141 is formed. And in at least one variation, the ferrite cold plate 140 is formed by sintering of ferrite material powder such that the secondary cooling chamber 150 with the secondary fins 152*f* integral with the base 141 is formed. In the alternative, one or more of the secondary fins 152*f* are not integral with the base 141 and are attached to the base 141 via welding, soldering, brazing, and/or use of adhesives. That is, one or more of the secondary fins 152*f* are separately formed from the ferrite cold plate 140 and subsequently attached to the base 141 within the secondary cooling chamber 150.

Still referring to FIG. 3, in some variations at least a portion or subset of the secondary fins 152*f* are arcuate-shaped (i.e., are not straight or linear between one end and another end when viewed from the z-direction in the figure) and at least another portion or another subset of the secondary fins 152*f* are straight fins (i.e., are straight or linear when viewed from the z-direction in the figure). For example, in variations where the secondary cooling chamber 150 includes the second cooling chamber 152 and the third cooling chamber 154, the second cooling chamber 152 can include one or more arcuate-shaped fins 152*a* and the third cooling chamber 154 can include one or more straight-shaped fins 154*s*. In addition, one or more peg-shaped fins 154*p* can be included in the third cooling chamber 154 and thus in the secondary cooling chamber 150.

In operation, the vehicle 12 is positioned over (z-direction) the charging station 14 and the transmitter coil 26 (FIG. 1) is energized via the power source 30 and inductively coupled to the receiver coil 120 such that an alternating current is generated in the receiver coil 120. The rectifier 100 draws and converts the alternating current from the receiver coil 120 into direct current and the battery (not shown) of the vehicle 12 is charged with the direct current provided by the rectifier 100. The rectifier 100 generates heat while converting the alternating current to direct current and inductive coupling of the transmitter coil 26 with the receiver coil 120 results in electromagnetic radiation (EMR) leakage from the receiver coil 120. However, the ferrite cold plate 140 shields the rectifier 100 from the EMR leakage such that the rectifier 100 and the receiver coil 120 (and other electronic components) are positioned in close proximity of each other. Stated differently, the ferrite cold plate 140 shields the rectifier 100 such that the rectifier 100 and the receiver coil 120 can be positioned in close proximity to each other within the in-vehicle wireless receiver pad 16. In addition, fluid 'F' flows into the ferrite cold plate 140 via the fluid inlet 142, through the fluid chamber 146, and exits the ferrite cold plate 140 via the fluid outlet 144 such that heat is extracted from the rectifier 100 and overheating and/or efficiency losses due to undesirable temperature increases of the rectifier 100 and the receiver coil 120 are inhibited.

In some variations, the rectifier 100 is positioned adjacent to or directly above (z-direction) the primary cooling chamber 148 in order to enhance heat flow from the rectifier 100 to the primary fins 160*f*. Particularly, the rectifier 100 is in thermal contact with the heat spreader plate 160 and the primary fins 162*f*, and as fluid F flows through the primary cooling chamber 148 as indicated by the arrows in FIG. 3, heat from the primary fins 160*f* is transferred to the fluid F such that desired heat extraction (i.e., cooling) from the rectifier 100 is provided.

The fluid F flows out of the primary cooling chamber 148, e.g., through a gateway 149, and into the second cooling chamber 152. Heat from the receiver coil 120 is transferred or conducted to the arcuate-shaped fins 152*a* and transferred to the fluid F flowing through the second cooling chamber 152. That is, the receiver coil 120 is in thermal contact with the ferrite cold plate 140 and the arcuate-shaped fins 152*a*, and heat from the receiver coil 120 is transferred to the arcuate-shaped fins 152*a* and then to the fluid F. Also, the arcuate-shaped fins 152*a* direct flow of the fluid F to an outer flow path 153 such that heat transfer between the arcuate-shaped fins 152*a* and the fluid F is enhanced. Stated differently, the arcuate-shaped fins 152*a* ensure the fluid F flows through the entirety of the second cooling chamber 152 and thereby ensure most or all of the arcuate-shaped fins 152*a* are used or exploited to extract heat from the receiver coil 120.

The fluid F exits the second cooling chamber 152, e.g., through a gateway 155, and enters the third cooling chamber 154 where heat from the receiver coil 120 is transferred or conducted to the peg-shaped fins 154*p* and straight-shaped fins 154*s*, which is transferred to the fluid F before exiting the ferrite cold plate 140 via fluid outlet 144.

Figure 4:
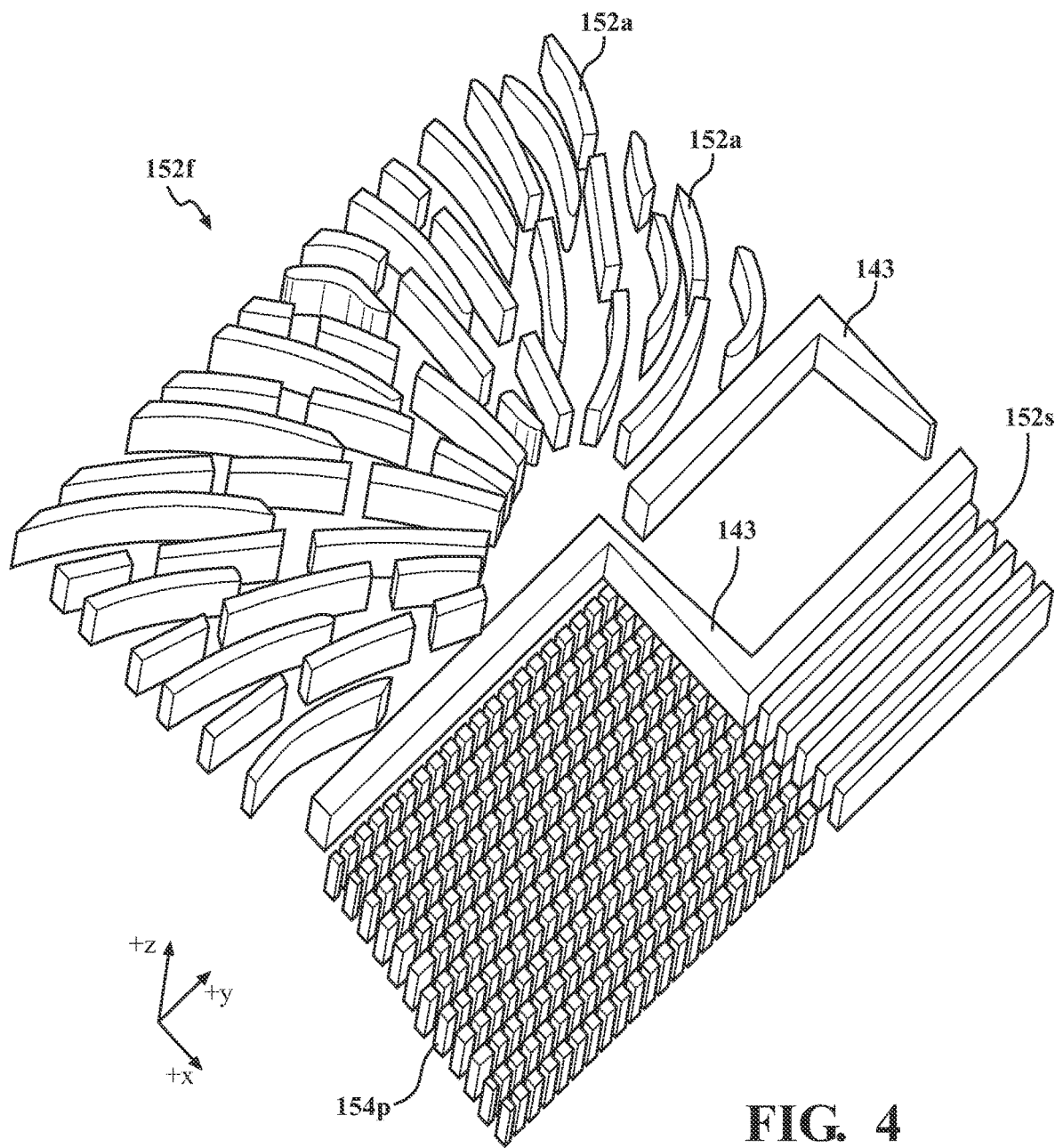
FIG. 4 is a perspective of fins that direct fluid flow through the ferrite cold plate according to another form of the present disclosure.

While FIGS. 2 and 3 illustrate the arcuate-shaped fins 152*a*, the straight-shaped fins 154*s*, and the peg-shaped fins 154*p* being integral with the ferrite cold plate 140, in some variations machining of the ferrite cold plate material is difficult. Accordingly, and with reference to FIG. 4, in one form of the present disclosure one or more of the arcuate-shaped fins 152*a*, the peg-shaped fins 154*p* and the straight-shaped fins 154*s* are formed as separate fins (pieces) that are attached to the ferrite cold plate 140 and/or the heat spreader plate 160. In addition, one or more walls 143 that define or at least partially define the first cooling chamber 148 the second cooling chamber 152 and/or the third cooling chamber 154 can be formed as separate pieces that are attached to the ferrite cold plate 140 and/or the heat spreader plate 160. In some variations, the arcuate-shaped fins 152*a*, the straight-shaped fins 154*s*, and/or the peg-shaped fins 154*p* are ferrite fins, i.e., formed from ferrite material, while in other variations, the arcuate-shaped fins 152*a*, the straight-shaped fins 154*s*, and/or the peg-shaped fins 154*p* are not ferrite fins. For example, the arcuate-shaped fins 152*a*, the straight-shaped fins 154*s*, and/or the peg-shaped fins 154*p* are formed from the same material as the heat spreader plate.

Figures 5, 5A:
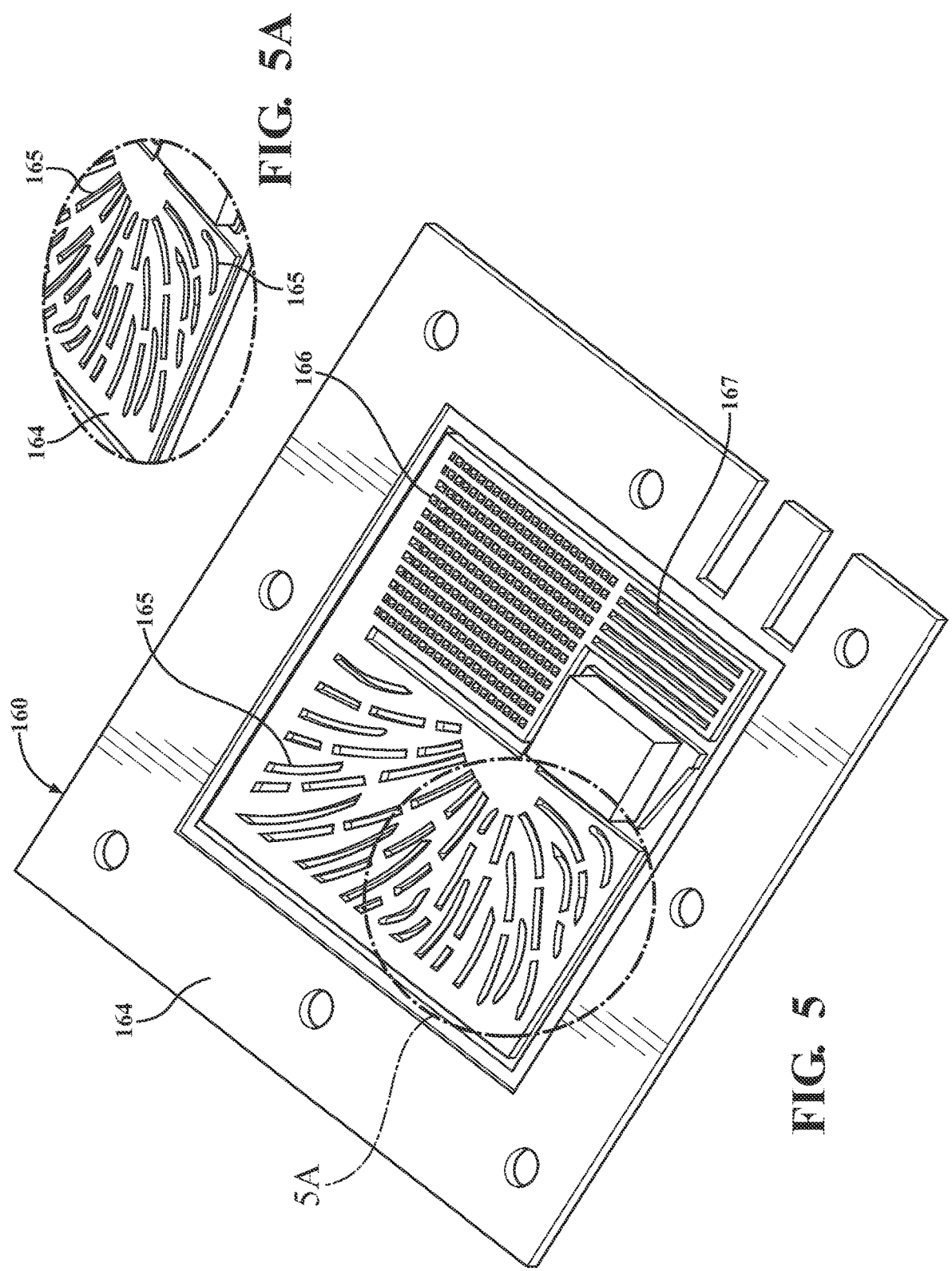
FIG. 5 is a perspective view of a heat spreader plate of the in-vehicle wireless receiver pad according to one form of the present disclosure.
FIG. 5A is an enlarged view of section 5A in FIG. 5.

For example, and with reference to FIGS. 5 and 5A, in some variations the lower surface 164 of the heat spreader plate 160 includes slots 165, 166, and/or 167 that are complimentary in shape with the arcuate-shaped fins 152*a*, the peg-shaped fins 154*p* and/or the straight-shaped fins 154*s* such that the arcuate-shaped fins 152*a*, the peg-shaped fins 154*p* and/or the straight-shaped fins 154*s* are disposed at least partially within the slots 165, 166, and/or 167, respectively. That is, the slots 165, 166, and/or 167 assist in attachment of the arcuate-shaped fins 152*a*, the peg-shaped fins 154*p* and/or the straight-shaped fins 154*s* to the heat spreader plate 160. In some variations the arcuate-shaped fins 152*a*, the peg-shaped fins 154*p* and/or the straight-shaped fins 154*s* are mechanically attached to the heat spreader plate 160 via press fit into the slots 165, 166, and/or 167, respectively, with or without the use of adhesive. In other variations the arcuate-shaped fins 152*a*, the peg-shaped fins 154*p* and/or the straight-shaped fins 154*s* are disposed at least partially within the slots 165, 166, and/or 167, respectively, and attached to the heat spreader plate 160 via welding, brazing or soldering (with or without a press fit). And while FIGS. 5 and 5A show the slots 165, 166, 167 in the heat spreader plate 160, in some variations the slots 165, 165, and/or 167 are formed in the base 141 of the fluid chamber 146 such that the arcuate-shaped fins 152*a*, the peg-shaped fins 154*p* and/or the straight-shaped fins 154*s* formed as separate pieces are attached to the ferrite cold plate 140 as described above with respect to the heat spreader plate 160. In addition, it should also be understood that the primary fins 160f can be formed as separated pieces and be mechanically attached to and extend from the base 141 of the ferrite cold plate 140.

The foregoing description is merely illustrative in nature and is in no way intended to limit the disclosure, its application, or uses. For example, it should be understood that fins with shapes and sizes different than the fins described above are included within the teachings of the present disclosure. Also, work of the presently named inventors, to the extent it may be described in this background section, as well as aspects of the description that may not otherwise qualify as prior art at the time of filing, are neither expressly nor impliedly admitted as prior art against the present technology.

As used herein, the phrase at least one of A, B, and C should be construed to mean a logical (A or B or C), using a non-exclusive logical "or." It should be understood that the various steps within a method may be executed in different order without altering the principles of the present disclosure; various steps may be performed independently or at the same time unless otherwise noted. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment is included in at least one embodiment or aspect. The appearances of the phrase "in one aspect" (or variations thereof) are not necessarily referring to the same aspect or embodiment.

While particular embodiments have been described, alternatives, modifications, variations, improvements, and substantial equivalents that are or may be presently unforeseen may arise to applicants or others skilled in the art. Accordingly, the appended claims as filed and as they may be amended, are intended to embrace all such alternatives, modifications variations, improvements, and substantial equivalents.

What is claimed is:

1. A wireless charging pad comprising:
   a rectifier;
   a receiver coil; and
   a ferrite cold plate in thermal contact with and sandwiched between the rectifier and the receiver coil, wherein the ferrite cold plate comprises a fluid inlet, a fluid outlet, and a fluid chamber in fluid communication with the fluid inlet and the fluid outlet.

2. The wireless charging pad according to claim 1, wherein the rectifier is a PCB-based rectifier and the receiver coil is a PCB-based receiver coil.

3. The wireless charging pad according to claim 1 further comprising a plurality of fins disposed in the fluid chamber.

4. The wireless charging pad according to claim 3, wherein the fluid chamber comprises a primary cooling chamber and the rectifier is positioned adjacent to the primary cooling chamber.

5. The wireless charging pad according to claim 4 further comprising a heat spreader plate in thermal contact with and sandwiched between the rectifier and the ferrite cold plate, wherein the plurality of fins comprises a plurality of primary fins extending from the heat spreader plate into the primary cooling chamber.

6. The wireless charging pad according to the claim 5, wherein the plurality of primary fins are integral with the heat spreader plate.

7. The wireless charging pad according to claim 5, wherein the fluid chamber further comprises a secondary cooling chamber in fluid communication with and downstream from the primary cooling chamber.

8. The wireless charging pad according to claim 7, wherein the plurality of fins further comprises a plurality of secondary cooling fins disposed in the secondary cooling chamber.

9. The wireless charging pad according to claim 8, wherein the plurality of secondary cooling fins extends from a base of the ferrite cold plate into the secondary cooling chamber.

10. The wireless charging pad according to claim 8, wherein the plurality of secondary cooling fins extends from the heat spreader plate into the secondary cooling chamber.

11. The wireless charging pad according to claim 10, wherein the plurality of secondary cooling fins are a plurality of ferrite fins.

12. The wireless charging pad according to claim 11, wherein the plurality of secondary cooling fins are mechanically attached to the heat spreader plate.

13. The wireless charging pad according to claim 12, wherein the heat spreader plate is an aluminum plate comprising a plurality of slots and the plurality of secondary cooling fins are disposed within the plurality of slots.

14. The wireless charging pad according to claim 1, wherein the ferrite cold plate has a thickness between about 5 mm and about 25 mm.

15. The wireless charging pad according to claim 1, wherein the ferrite cold plate comprises a ferrite-ceramic composite.

16. A wireless charging pad comprising:
   a PCB-based rectifier;
   a PCB-based receiver coil;
   an aluminum plate in thermal contact with the PCB-based rectifier and sandwiched between the PCB-based rectifier the PCB-based receiver coil; and
   a ferrite cold plate in thermal contact with and sandwiched between the PCB-based receiver coil and the aluminum plate, wherein the ferrite cold plate comprises a fluid inlet, a fluid outlet, a fluid chamber in fluid communication with the fluid inlet and the fluid outlet, and a plurality of fins disposed in the fluid chamber and configured to direct flow of a cooling fluid from the fluid inlet to the fluid outlet.

17. The wireless charging pad according to claim 16, wherein the fluid chamber comprises a primary cooling chamber and a secondary cooling chamber, the PCB-based rectifier is positioned adjacent to the primary cooling chamber, and the aluminum plate comprises a plurality of primary fins extending from a surface oppositely disposed from the PCB-based rectifier into the primary cooling chamber.

18. The wireless charging pad according to claim 17 further comprising a plurality of secondary cooling fins disposed in the secondary cooling chamber, wherein the plurality of secondary cooling fins are attached to and extend from at least one of a base of the ferrite cold plate and the aluminum plate.

19. A wireless charging pad comprising:
   a PCB-based rectifier;
   a PCB-based receiver coil;
   a heat spreader plate in thermal contact with the PCB-based rectifier and sandwiched between the PCB-based rectifier and the PCB-based receiver coil; and
   a ferrite cold plate in thermal contact with and sandwiched between the PCB-based receiver coil and the heat spreader plate, wherein the ferrite cold plate comprises a fluid inlet, a fluid outlet, a fluid chamber in fluid communication with the fluid inlet and the fluid outlet, and a plurality of fins disposed in the fluid chamber and configured to direct flow of a cooling fluid from the fluid inlet to the fluid outlet, wherein the fluid chamber comprises a primary cooling chamber and a secondary cooling chamber, and the heat spreader plate comprises a plurality of primary fins disposed in the primary cooling chamber.

20. The wireless charging pad according to claim 19 further comprising a plurality of secondary cooling fins disposed in the secondary cooling chamber, wherein the plurality of secondary cooling fins are attached to and extend from at least one of a base of the ferrite cold plate and the heat spreader plate.

* * * * *